(12) United States Patent
Weon et al.

(10) Patent No.: US 6,368,925 B2
(45) Date of Patent: Apr. 9, 2002

(54) METHOD OF FORMING AN EPI-CHANNEL IN A SEMICONDUCTOR DEVICE

(75) Inventors: Dae Hee Weon; Seung Ho Hahn, both of Kyunghi-Do (KR)

(73) Assignee: Hyundai Electronics Industries Co., Ltd., Kyungki-do (KR)

(*) Notice: Subject to any disclaimer, the term of this patent is extended or adjusted under 35 U.S.C. 154(b) by 0 days.

(21) Appl. No.: 09/882,201

(22) Filed: Jun. 15, 2001

(30) Foreign Application Priority Data

Jun. 30, 2000 (KR) .............................. 00-37005

(51) Int. Cl.$^7$ ............................................. H01L 21/336
(52) U.S. Cl. .................... 438/289; 438/226; 438/481; 257/268
(58) Field of Search .................. 438/287–307, 438/226, 269, 341, 357, 416, 429, 442, 481; 257/268–270, 327–338

(56) References Cited

U.S. PATENT DOCUMENTS 6,303,451 B1 * 10/2001 Zhang et al. ................ 438/301
6,303,454 B1 * 10/2001 Yeh ............................. 438/305

* cited by examiner

*Primary Examiner*—Jey Tsai
(74) *Attorney, Agent, or Firm*—Marshall, Gerstein & Borun

(57) ABSTRACT

An epi-channel of a uniform shape is formed by adjusting the temperature and pressure of $H_2$ bake process to prevent the etching of a separation oxide at an interface of an active region and a field region thereby ensuring that an epi-channel is formed having a uniform shape.

20 Claims, 3 Drawing Sheets

900°C Bake and Epi Growth

800°C Bake and Epi Growth

US 6,368,925 B2

METHOD OF FORMING AN EPI-CHANNEL IN A SEMICONDUCTOR DEVICE

BACKGROUND OF THE INVENTION

1. Field of the Invention

The invention relates generally to a method of forming an epi-channel in a semiconductor device. More particularly, the invention relates to a method of forming an epi-channel in a semiconductor device wherein the epi-channel has a uniform shape. Still more particularly, the invention relates to a method of forming an epi-channel in a semiconductor device that avoids the etching or deterioration of the insulating structure in the surface of a semiconductor substrate.

2. Description of the Prior Art

In a CMOS structure, an epitaxial channel forming process utilizes a SEG process to form a channel below a gate oxide in an epi-silicon layer. Advantages of the epi-channel process include increase in a drain saturation current and reduction in a short channel effect. Also, as the gate oxide is formed of epi-silicon, the physical property of the gate oxide can be improved. Applying the general SEG process includes several problems. In an ESD process using SEG, $H_2$ bake is used as an in-situ cleaning. The purpose of using the $H_2$ bake is to remove oxide on the silicon surface or etch away defects.

Generally, the surface cleaning effect will improve by increasing the temperature and lowering the pressure. Therefore, the SEG process using a LPCVD method must perform the $H_2$ bake at a temperature of more than 900° C. and under a pressure of below 20 Torr. The $H_2$ bake at the temperature of more than 900° C. and below the pressure of 20 Torr acts to clean the silicon surface, but Vt ion-implanted (i.e., channel ion-implanted) ions are diffused into the substrate. Therefore, not only Vt of the device is made irregular but also an insulating material of the device is etched to remove the insulating material formed at the active silicon interface. Etching of the insulting oxide causes an epi-growth at the active side when the epi-channel process is performed, resulting in an irregular shape of the epi channel. Thus, subsequent processes are difficult to conduct and the irregular shape of the epi-channel deteriorates the electrical property of the device.

A method of forming an epi-channel in a conventional semiconductor device will be now explained by reference to the accompanying drawings. FIGS. 1A to 1C are cross-sectional views illustrating a prior art method of forming an epi-channel in a conventional semiconductor device.

Referring now to FIG. 1A, the remaining regions except for an active region in which a device will be formed in a semiconductor device 1 are etched to form a trench structure. Then, the trench structure is covered with an insulating material 6. In order to adjust the threshold voltage Vt, ions are implanted into the surface 1a of the semiconductor device 1.

Referring to FIG. 1B, in order to remove various oxide films including crystal defects and a native oxide film on the surface of the semiconductor substrate 1, a $H_2$ bake process is implemented. At this time, the $H_2$ bake process is performed at the temperature of more than 900° C. and under the pressure of below 20 Torr in order to increase a cleaning effect. Due to the increased temperature and decreased pressure, ions that were implanted into the surface of the semiconductor substrate 1a in order to adjust the threshold voltage are diffused into the inside of the semiconductor substrate 1, thereby changing a desired threshold voltage.

Also due to excess cleaning effect, the upper portion 6a of the insulating material 6 contacting the silicon portion of the semiconductor substrate to be grown is etched.

Referring now to FIG. 1C, by means of SEG process, silicon is grown to form an epi-channel 8. At this time, silicon is grown to the etched portion 6a of the insulating material 6, thus making the shape of the epi-channel irregular.

FIG. 2 is a TEM photography showing an epi-channel formed according to a method of forming an epi-channel in a conventional semiconductor device. As shown, the sidewall of the grown epi-channel, that is epi-silicon is formed unevenly.

As a result, as the $H_2$ bake process is performed at high temperature and at low pressure for removing defects on the surface of the semiconductor substrate and for increasing the cleaning effect, the upper portion of the insulating material 6 is undesirably etched, thereby forming an irregularly shaped epi-channel.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE PRESENTLY PREFERRED EMBODIMENTS

Figure 1A:
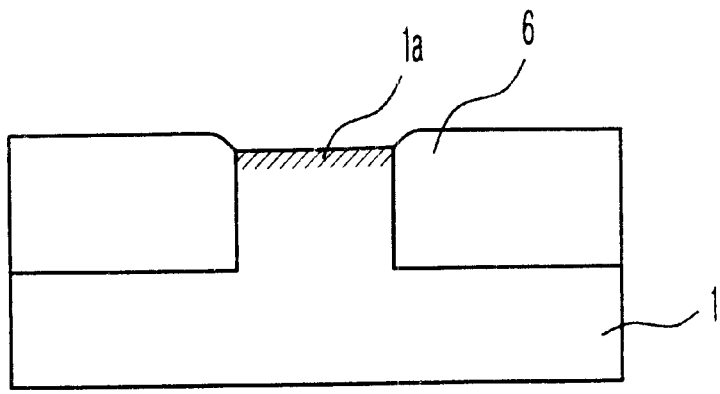
FIGS. 1A to 1C are cross-sectional views illustrating a prior art method of forming an epi-channel in a conventional semiconductor device.
Figure 1B:
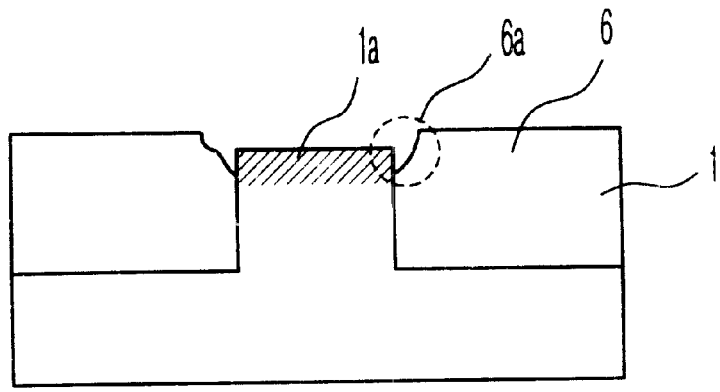
Figure 1C:
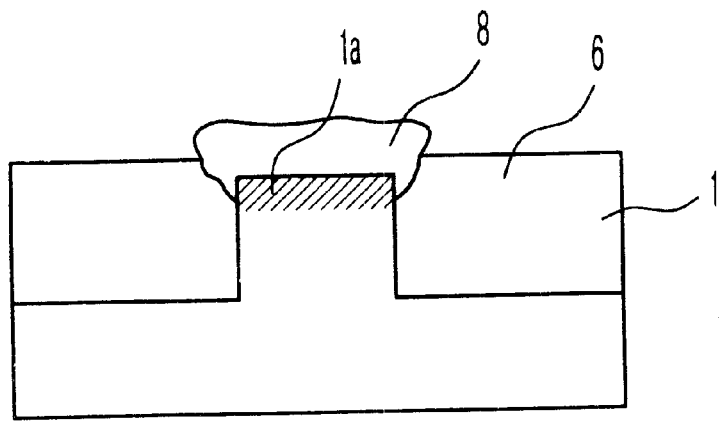
Figure 2:
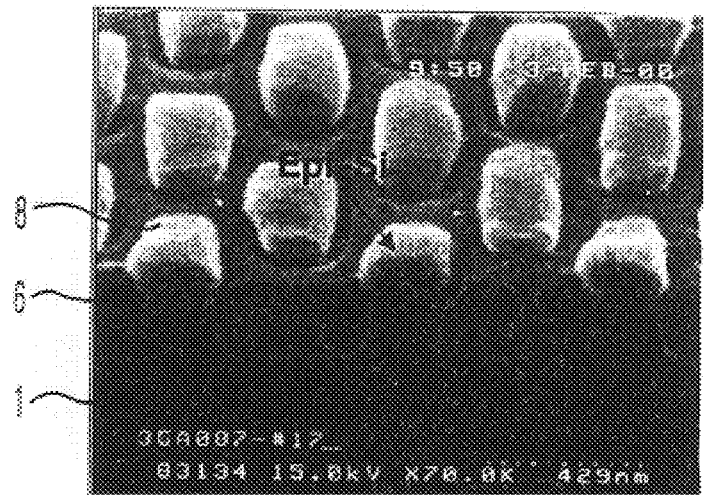
FIG. 2 is a TEM photograph showing an epi-channel formed according to a prior art method of forming an epi-channel in a conventional semiconductor device.

The disclosed method forms an epi-channel in a semiconductor device wherein defects on the surface of a semiconductor substrate are removed and cleaned while an upper portion of an insulating material contacting the silicon substrate is not etched, and the performance of a $H_2$ bake process still results in an epi-channel of an regular shape.

The disclosed method comprises the steps of sequentially forming a pad oxide film and a nitride film on a semiconductor substrate and then patterning the pad oxide film and the nitride film, etching the exposed portion of the semiconductor substrate to form a trench structure and then burying the trench structure with an insulating material, removing the nitride film and then implementing ion implantation process for forming a well, forming a screen oxide film and then implementing ion implantation process for adjusting the threshold voltage, removing crystal defects and an oxide film on the surface of the semiconductor substrate by $H_2$ bake process, and growing the exposed semiconductor substrate by a SEG process to form an epi-channel.

In the disclosed process, the pad oxide film is formed with a thickness ranging from about 50 Å to about 200 Å and the nitride film is form with a thickness ranging from about 1000 Å to about 3000 Å.

After the trench is formed by etching the semiconductor substrate in thickness ranging from about 1500 Å to about 4000 Å, a thermal oxide film having the thickness ranging from about 50 Å to about 200 Å is formed at the sidewall of the trench.

The insulating material is formed by a high-density chemical vapor deposition method or an ozone TEOS chemical vapor deposition method, wherein after the insulating material is formed with a thickness ranging from about 3000 Å to about 5000 Å greater than the nitride film, a chemical mechanical polish process is carried out until the surface of the nitride film is exposed.

The thermal process performed after the formation of the well is implemented using a RTP process at a temperature of about 950° C. and for a time period of about 10 to about 100 seconds.

The ion implantation process for adjusting the threshold voltage is performed by implanting B or $BF_2$ ions having the dose of 1E12~3E13 ions/$cm^2$ with the ion implantation energy of about 1 to about 5 KeV as an ultra-low energy. After that, a native oxide film is removed using HF solution or BOE solution.

The $H_2$ bake process is in-situ implemented under the pressure ranging from about 0.1 Torr to about 10 Torr and at the temperature ranging from about 750° C. to about 850° C. for a time period ranging from about 1 to about 5 minutes.

The SEG process grows the semiconductor substrate in thickness ranging from about 100 Å to about 500 Å using $H_2$ gas as a carrier gas and DSC and HCl in the LPCVD equipment, wherein the flow rate of the $H_2$ gas is in the range of about 5 slm to about 30 slm, the flow rate of DSC is in the range of about 50 sccm to about 300 sccm and the flow rate of HCl is in the range of about 50 sccm to about 200 sccm.

The disclosed process and device will now be described in detail by reference to accompanying drawings.

Figure 3A:
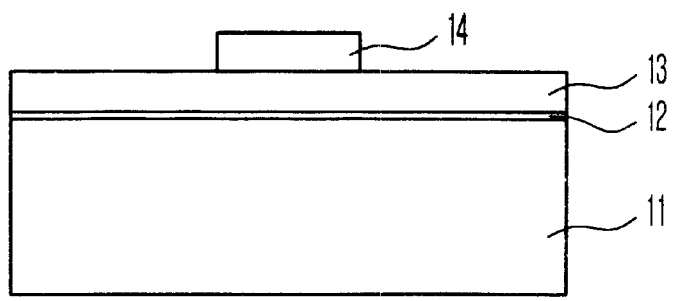
FIGS. 3A to 3E are cross-sectional views illustrating a method of forming an epi-channel in a semiconductor device according to the present invention.

FIGS. 3A to 3E show cross-sectional views illustrating a method of forming an epi-channel in a semiconductor device according to the present invention. Referring now to FIG. 3A, a pad oxide film 12 and a nitride film 13 are sequentially formed on a semiconductor substrate 11. Then a photosensitive film pattern 14 is formed on the nitride film 13.

The pad oxide film 12 is formed with a thickness preferably ranging from about 50 Å to about 200 Å and the nitride film 14 is formed with a thickness ranging from about of 1000 Å to about 3000 Å.

Figure 3B:
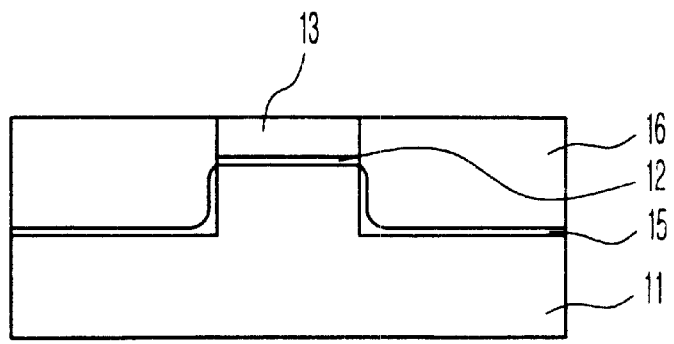

Referring to FIG. 3b, the nitride film 13 and the pad oxide film 12 are patterned by etch process using a photosensitive film pattern. Next, the exposed semiconductor substrate 11 is etched to form a trench with depth ranging from about 1500 Å to about 4000 Å.

Thereafter, a thermal oxide film 15 is formed at the sidewall of the trench by oxidization process and the trench is covered with an insulating material 16 for device separation.

The thermal oxide film 15 is formed in order to reduce interface trap charges. The thermal oxide film 15 has a thickness preferably ranging from about 50 Å to about 200 Å. The insulating material 16 burying the trench is formed a high-density plasma chemical vapor deposition method or an ozone TEOS chemical vapor deposition method. The insulating material 16 is formed with a thickness preferably ranging from about 3000 Å to about 5000 Å than the nitride film 13 and is then subjected to chemical mechanical polish process so that the surface of the nitride film 13 can be exposed.

Figure 3C:
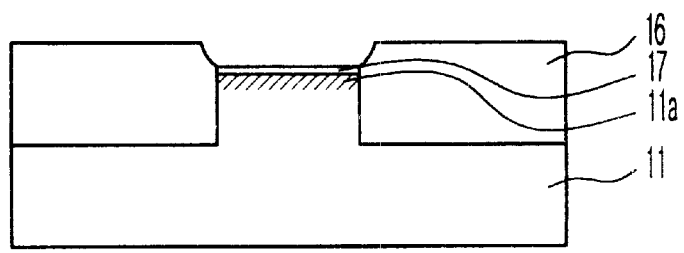

Referring now to FIG. 3C, after the nitride film is removed, an ion implantation process for forming a well and a thermal process are sequentially performed. After the well is formed, a screen oxide film 17 is formed and is then subjected to an ion implantation process for adjusting the threshold voltage Vt.

The thermal or heating process 15 performed after the ion implantation process forms the well and is carried out at the temperature of about 950° C. for a time period preferably ranging from about 10 to about 100 seconds. The thermal process can be characterized as an RTP process. The ion implantation process for adjusting the threshold voltage is performed by implanting B or $BF_2$ ions at a dose preferably ranging from about 1E12 to about 3E13 ions/$cm^2$ with an ion implantation energy preferably ranging from about 1 to about 5 KeV, wherein the ion implantation process is performed by an ultra-low energy ion implantation process since ions are shallowly implanted on the surface 11a of the semiconductor substrate 11.

Figure 3D:
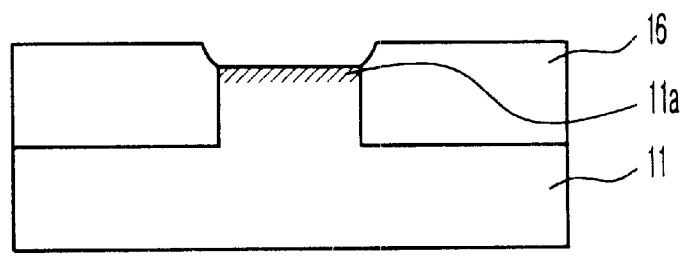

Referring now to FIG. 3D, in order to remove the screen oxide film 17 and a native oxide film remaining on the semiconductor substrate 11, a cleaning process is implemented. After all the oxide films on the semiconductor substrate 11 are removed, a surface process is carried out in order to remove defects, etc. on the surface of the semiconductor substrate 11.

The cleaning process for removing the oxide films is performed by use of HF or BOE solution. The surface process for the semiconductor substrate 11 is in-situ implemented by a $H_2$ bake process under the pressure preferably ranging from about 0.1 Torr to about 10 Torr and at the temperature preferably ranging from about 750° C. to about 850° C. and for a time preferably ranging from about 1 to about 5 minutes.

Figure 3E:
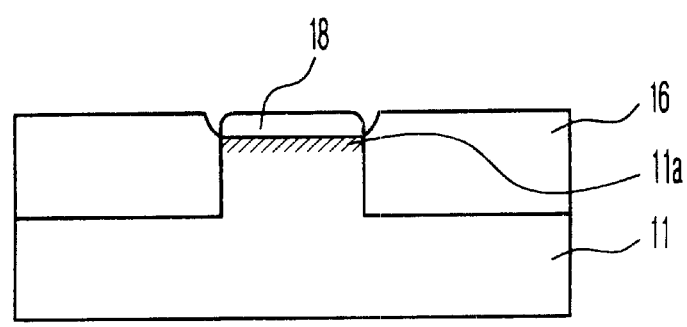

Referring now to FIG. 3E, after the surface processing process, silicon is grown to form an epi-channel 18.

The epi-channel 18 is formed by growing silicon with thickness preferably ranging from about 100 Å to about 500 Å by an SEG process, wherein $H_2$ gas is used as a carrier gas, and DCS (Dichlorosilame; $SiH_2Cl_2$) and HCl are used. At this time, the flow rate of the $H_2$ gas is preferably in a range of about 5 slm to about 30 slm, the flow rate of DSC is preferably in the range of about 50 sccm to about 300 sccm and the flow rate of HCl is preferably in the range of about 50 sccm to about 200 sccm.

Figure 4:
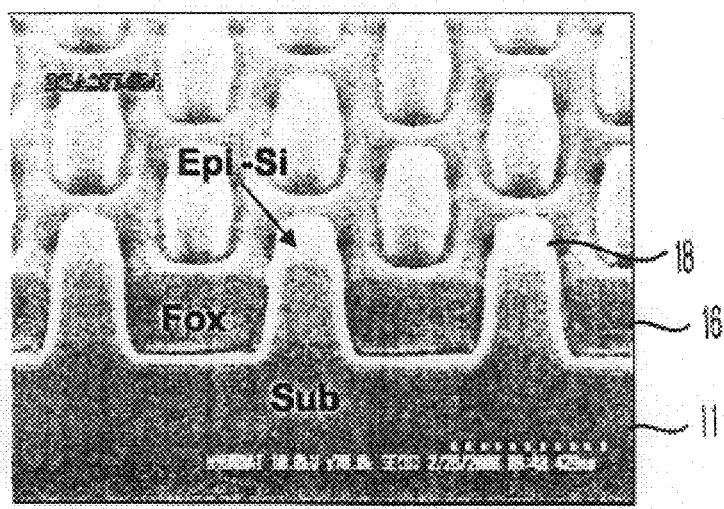
FIG. 4 is a TEM photograph showing an epi-channel formed according to a method of forming an epi-channel in a semiconductor device according to the present invention.

FIG. 4 is a TEM photograph showing an epi-channel formed according to a method of forming an epi-channel in a semiconductor device according to the present invention.

Referring now to FIG. 4, it can be seen that the trench formed at the semiconductor substrate 11 is buried with the insulating material 16 and the exposed semiconductor substrate 11, that is, silicon is grown to form an epi-channel 18 of a uniform shape. As shown, as the upper of the sidewall of the insulating material 16 contacting the trench in the semiconductor substrate is uniformly formed without being etched, the epi-channel is formed into a uniform shape.

As mentioned above, the disclosed process forms an epi-channel of a uniform shape, by adequately adjusting the surface processing process conditions performed before growing silicon and then growing silicon without the upper portion of the insulating material contacting silicon being etched. Therefore, the disclosed method has advantages that it can perform easily a subsequent process and improve the electrical properties of the resulting product.

The disclosed method has been described with reference to a particular embodiment in connection with a particular application. Those having ordinary skill in the art and access to the teachings of the disclosed method will recognize additional modifications and applications that fall within the scope of the disclosed method. It is therefore intended that the appended claims cover any and all such applications, modifications, and embodiments that fall within the scope of the disclosed method.

What is claimed is:

1. A method of forming an epi-channel in a semiconductor device, comprising:

sequentially forming a pad oxide film and a nitride film on a surface of a semiconductor substrate and then patterning the pad oxide film and the nitride film to leave an exposed portion of the semiconductor substrate;

etching the exposed portion of the semiconductor substrate to form a trench structure and then covering said trench structure with an insulating material;

removing said nitride film and then implementing an ion implantation process for forming a well;

forming a screen oxide film in the well and then implementing an ion implantation process for adjusting a threshold voltage;

removing crystal defects and the screen oxide film on the surface of said semiconductor substrate by a $H_2$ bake process; and growing the exposed semiconductor substrate by a SEG process to form an epi-channel.

2. The method of forming an epi-channel in a semiconductor device according to claim 1, wherein said pad oxide film is formed with thickness ranging from about 50 Å to about 200 Å.

3. The method of forming an epi-channel in a semiconductor device according to claim 1, wherein said nitride film is formed with a thickness ranging from about 1000 Å to about 3000 Å.

4. The method of forming an epi-channel in a semiconductor device according to claim 1, wherein said trench is formed by etching said semiconductor substrate that the trench has a depth ranging from about 1500 Å to about 4000 Å.

5. The method of forming an epi-channel in a semiconductor device according to claim 1, wherein the trench further comprises a sidewall and, after said trench is formed, a thermal oxide film having a thickness ranging from about 50 Å to about 200 Å and is formed at the sidewall of said trench.

6. The method of forming an epi-channel in a semiconductor device according to claim 1, wherein said insulating material is formed by one of a high-density chemical vapor deposition method or an ozone TEOS chemical vapor deposition method.

7. The method of forming an epi-channel in a semiconductor device according to claim 1, wherein said insulating material is formed with a thickness from about 3000 Å to about 5000 Å greater than a thickness of said nitride film and the insulating material is then subjected to a chemical mechanical polish process until a surface of said nitride film is exposed.

8. The method of forming an epi-channel in a semiconductor device according to claim 1, wherein a heating process performed after the formation of the well at the temperature of about 950° C. and for a time period ranging from about 10 to about 100 seconds.

9. The method of forming an epi-channel in a semiconductor device according to claim 1, wherein said ion implantation process for adjusting the threshold voltage is performed by implanting B or $BF_2$ ions at a dose ranging from about 1E12 to about 3E13 ions/cm$^2$ with an ion implantation energy ranging from about 1 to about 5 KeV.

10. The method of forming an epi-channel in a semiconductor device according to claim 1, wherein after the step of ion implantation for adjusting the threshold voltage, a native oxide film is removed using HF solution or BOE solution.

11. The method of forming an epi-channel in a semiconductor device according to claim 1, wherein said $H_2$ bake process is in-situ implemented under a pressure ranging from about 0.1 Torr to about 10 Torr and at the temperature ranging from about 750° C. to about 850° C. and for a time period ranging from about 1 to about 5 minutes.

12. The method of forming an epi-channel in a semiconductor device according to claim 1, wherein said SEG process is carried out in LPCVD equipment and said SEG process increases said semiconductor substrate in thickness in an amount ranging from about 100 Å to about 500 Å using $H_2$ gas as a carrier gas with DCS and HCl in the LPCVD equipment.

13. The method of forming an epi-channel in a semiconductor device according to claim 12, wherein a flow rate of the $H_2$ gas ranges from about 5 slm to about 30 slm, a flow rate of DCS ranges from about 50 sccm to about 300 sccm and a flow rate of HCl ranges from about 50 sccm to about 200 sccm.

14. A semiconductor device formed by the method of claim 1.

15. A method of forming an epi-channel in a semiconductor device, comprising:

sequentially forming a pad oxide film and a nitride film on a surface of a semiconductor substrate and then patterning the pad oxide film and the nitride film to leave an exposed portion of the semiconductor substrate;

etching the exposed portion of the semiconductor substrate to form a trench structure and then burying said trench structure with an insulating material;

removing said nitride film and then implementing an ion implantation process for forming a well;

forming a screen oxide film in the well and then implementing an ion implantation process for adjusting a threshold voltage;

removing crystal defects and the screen oxide film on the surface of said semiconductor substrate by a $H_2$ bake process wherein said $H_2$ bake process is in-situ implemented under a pressure ranging from about 0.1 Torr to about 10 Torr and at the temperature ranging from about 750° C. to about 850° C. and for a time period ranging from about 1 minute to about 5 minutes; and growing the exposed semiconductor substrate by a SEG process to form an epi-channel.

16. The method of forming an epi-channel in a semiconductor device according to claim 15, wherein said SEG process is carried out in LPCVD equipment and said SEG process increases said semiconductor substrate in thickness in an amount ranging from about 100 Å to about 500 Å using $H_2$ gas as a carrier gas with DSC and HCl in the LPCVD equipment.

17. The method of forming an epi-channel in a semiconductor device according to claim 16, wherein a flow rate of the $H_2$ gas ranges from about 5 slm to about 30 slm, a flow rate of DCS ranges from about 50 sccm to about 300 sccm and a flow rate of HCl ranges from about 50 sccm to about 200 sccm.

18. A semiconductor device formed by the method of claim 15.

19. A method of forming an epi-channel in a semiconductor device comprising:

turning a patterned pad oxide film and a nitride film on a surface of a semiconductor substrate thereby leaving an exposed first portion of the nitride film pad oxide film and substrate and a covered second portion of the substrate;

etching the exposed portion of the nitride film, pad oxide film and substrate to form a trench;

applying a layer of insulating material on top of the trench;

removing at least the nitride film from the second portion of the substrate and implanting ions at the second portion of the substrate to form a well;

forming a screen oxide layer in the well and implanting ions in the well;

removing the screen oxide film from the well by a $H_2$ bake process; and growing the second portion of the semiconductor substrate by a SEG process to form an epi-channel.

20. A semiconductor device made in accordance with the method of claim 19.

* * * * *